United States Patent

Jackson et al.

[11] Patent Number: 5,820,337
[45] Date of Patent: *Oct. 13, 1998

[54] DOUBLE WALL TURBINE PARTS

[75] Inventors: Melvin Robert Jackson, Niskayuna; David William Skelly, Burnt Hills; Raymond Grant Rowe, Niskayuna, all of N.Y.; Donald George LaChapelle, Cincinnati; Paul Stuart Wilson, Sharonville, both of Ohio

[73] Assignee: General Electric Company, Schenectady, N.Y.

[*] Notice: The term of this patent shall not extend beyond the expiration date of Pat. No. 5,626,462.

[21] Appl. No.: 814,047

[22] Filed: Mar. 6, 1997

Related U.S. Application Data

[63] Continuation-in-part of Ser. No. 368,512, Jan. 3, 1995, Pat. No. 5,626,462.
[51] Int. Cl.$^6$ ...................................................... F04D 29/44
[52] U.S. Cl. .......................................... 415/200; 416/97 R
[58] Field of Search ........................ 415/200; 416/97 R, 416/241 R

[56] References Cited

U.S. PATENT DOCUMENTS

| | | | |
|---|---|---|---|
| 5,536,146 | 7/1996 | Siga et al. | 415/200 |
| 5,601,411 | 2/1997 | Usami et al. | 415/200 |
| 5,626,462 | 5/1997 | Jackson et al. | 416/97 R |

*Primary Examiner*—John T. Kwon
*Attorney, Agent, or Firm*—Ernest G. Cusick; Noreen C. Johnson

[57] ABSTRACT

A double wall hot gas path part for turbines, such as an airfoil, combustor, duct or shroud, comprises an outer skin and an inner support wall that are metallurgically bonded to one another. The double wall contains integral channels for passage of cooling air adjacent to the skin. The skin may be a metal alloy skin or a microlaminate structure, including microlaminate composite structures. Microlaminate composites typically have a lower density than that of the material used for the support wall, and a simplified internal geometry, which promote weight reductions in the parts and increases in engine operating efficiency.

20 Claims, 6 Drawing Sheets fig. 1 fig. 2 fig. 2A fig. 3 fig. 4 fig. 5 fig. 6

DOUBLE WALL TURBINE PARTS

CROSS-REFERENCE TO RELATED APPLICATION

This application is a continuation-in-part of application Ser. No. 08/368,512 filed Jan. 3, 1995, now U.S. Pat. No. 5,626,462 issued May 6, 1997.

BACKGROUND OF THE INVENTION

The present invention relates generally to turbine parts which are, during the operation of the turbine, routinely exposed to temperatures of at least 900° C. Such parts are hereinafter sometimes collectively designated "hot gas path parts" or "HGP parts". More particularly, this invention pertains to HGP parts having a double wall construction with integral cooling channels. Most particularly, this invention pertains to double wall HGP parts having a microlaminate outer wall that is adapted to withstand high temperatures, such as are found in the hot sections of gas turbines, including gas turbine generators.

It is known that the temperatures of combustion gases in turbines and particularly in gas turbine engines, such as aircraft engines, during operation are considerably above the temperatures of the metal parts of the engine which are in contact with these gases. Operation of these engines at gas temperatures that are above the HGP part temperatures is a well established art, and depends on supplying cooling gas to the outer surfaces of the HGP parts through various methods. The HGP parts of these engines that are particularly subject to high temperatures, and thus require particular attention with respect to cooling, include airfoils such as blades and vanes (sometimes respectively designated "buckets" and "nozzles" in turbine generators), shrouds, combustors and ducts.

For example, with regard to the metal blades and vanes employed in aircraft engines, some cooling is achieved by convection by providing passages for flow of a cooling gas internally within the blades so that heat may be removed from the metal structure of the blade by the cooling gases. Such blades are essentially hollow core blades which may have a shell or plural shells of structural metal of intricate design surrounding equally intricate sets of cooling passages within the hollow core blade. Fine internal orifices have also been devised to direct this circulating cooling gas directly against certain inner surfaces of the shell to obtain cooling of the inner surface by impingement of the cooling gas against the surface, a process known as impingement cooling. In addition, an array of fine holes extending from the hollow core through the blade shell can provide for bleeding cooling air through the blade shell to the outer surface where a film of such air can protect the blade from direct contact with the hot gases passing through the engines, a process known as film cooling.

Using combinations of these cooling techniques, the maximum metal surface temperature of a blade can be maintained at about 1,150° C. while the blade is in an environment of hot gases having temperatures of up to 1,650° C.

As is well known, the operating efficiency of gas turbines and accordingly of jet engines is related to the operating temperature of the engine. To achieve higher operating efficiencies, operation of the engine at higher temperatures is desirable. For engines operating at temperatures up to 2,000° C., it is expected that the metal temperatures can be maintained almost at present levels with current cooling techniques by using a combination of improved cooling designs and thermal barrier coatings. Thermal barrier coatings are well known ceramic coatings such as yttria stabilized zirconia that are applied to the external surfaces of metal parts within engines to impede the transfer of heat from hot combustion gases to the metal parts. However, even with the use of advanced gas cooling designs and thermal barrier coatings, it is also desirable to decrease the requirement for cooling gases, because reducing the demand for cooling gases is also well known to improve overall engine operating efficiency. One way to achieve such a reduction is to improve the cooling of the metal parts immediately adjacent to their outer surfaces.

Another way in which the increased use of cooling air can be avoided, or cooling air requirements can be reduced, is by providing metal parts that are capable of operating above the maximum use temperature of 1,150° C. The provision of metal parts capable of operating at temperatures beyond 1,150° C. would allow either relaxation of cooling requirement or the reduction or elimination of the dependence on the thermal barrier coatings, or both.

It is also well known that the operating efficiency of gas turbine engines may be improved by reducing the total weight of the metal parts utilized. Currently, because of the required intricate internal cooling passages within metal parts such as blades and vanes, particularly near their outer surfaces, and the fragile nature of the ceramic cores used to define these passages during formation, it is necessary to utilize large tolerances that allow for the possibility of core shifting. The use of materials and processes that would simplify the design requirements for these internal passages would permit the amount of material used in each metal part to be reduced. Also, the use of materials that are less dense would achieve weight reductions for each metal part. Small savings can be significant because of the large number of these metal parts that are utilized in a typical engine.

Reducing the internal complexity of the metal parts by reducing the number of intricate passageways that must be formed by casting would also improve casting yields and provide an added benefit.

Therefore, it is desirable to define HGP parts and materials for their manufacture that have improved cooling capability, higher operating temperatures, more castable geometries and reduced weight as compared to present parts.

SUMMARY OF THE INVENTION

The present invention is a double wall HGP part for a turbine, said part having at least one integral, longitudinally extending cooling channel located in the double wall. The integral cooling channel comprises a means to provide additional cooling capacity to the exterior of the part. A skin is deposited on a support wall to define the integral channels. It is preferred that the skin be a microlaminate composite of a more ductile phase and a less ductile phase, where the less ductile phase also has significant high temperature strength. The more ductile phase may comprise an intermetallic compound or intermediate phase having significant high temperature strength.

This invention comprises a HGP turbine part having an outer double wall, comprising:

a partially hollow support wall that is attached to and extends longitudinally from a base and has a shaped outer surface, said support wall being formed from a first material and having at least one longitudinally extending recessed channel formed in the shaped outer surface; and a skin made from a second material which conforms to, covers and is metallurgically bonded to the outer surface of said support wall and covers the at least one recessed channel, wherein the combination of said skin and said support wall form a double wall structure and the covered, recessed channel forms at least one integral internal channel located within the double wall.

A significant advantage of this invention is that it provides HGP parts that may be utilized in hotter operating environments than are possible with prior art parts, thereby permitting a turbine engine that incorporates them to potentially be operated at temperatures that provide greater engine operating efficiencies.

Another significant advantage is that parts of the present invention may potentially be lighter due to for example, decreased densities of materials used for the skin and material reductions related to simpler internal geometries and smaller manufacturing tolerances.

Other objects, features and advantages of the HGP parts of this invention may be seen in the description and drawings set forth below, including the appended claims.

DETAILED DESCRIPTION; PREFERRED EMBODIMENTS

The present invention relates generally to turbine parts, such as blades or vanes, for use at high temperatures. More particularly, this invention pertains to parts having a double wall construction with a longitudinally extending integral cooling channel or channels. Most particularly, this invention pertains to double wall parts having a microlaminate outer wall that is adapted to withstand extremely high temperatures, such as are found in the hot sections of aircraft engines and other gas turbines.

The turbine parts of this invention are suitable for use in either the rotating or stationary portions of a turbine engine. They are preferably used in the hot sections of such engines where they are exposed to combustion gases having a temperature of about 1,650° C. or more.

For the sake of brevity, the invention will be described hereinafter principally with reference to the fabrication of airfoils. However, it should be understood that HGP parts other than airfoils may be fabricated by similar means which will be apparent to those skilled in the art.

Figure 1:
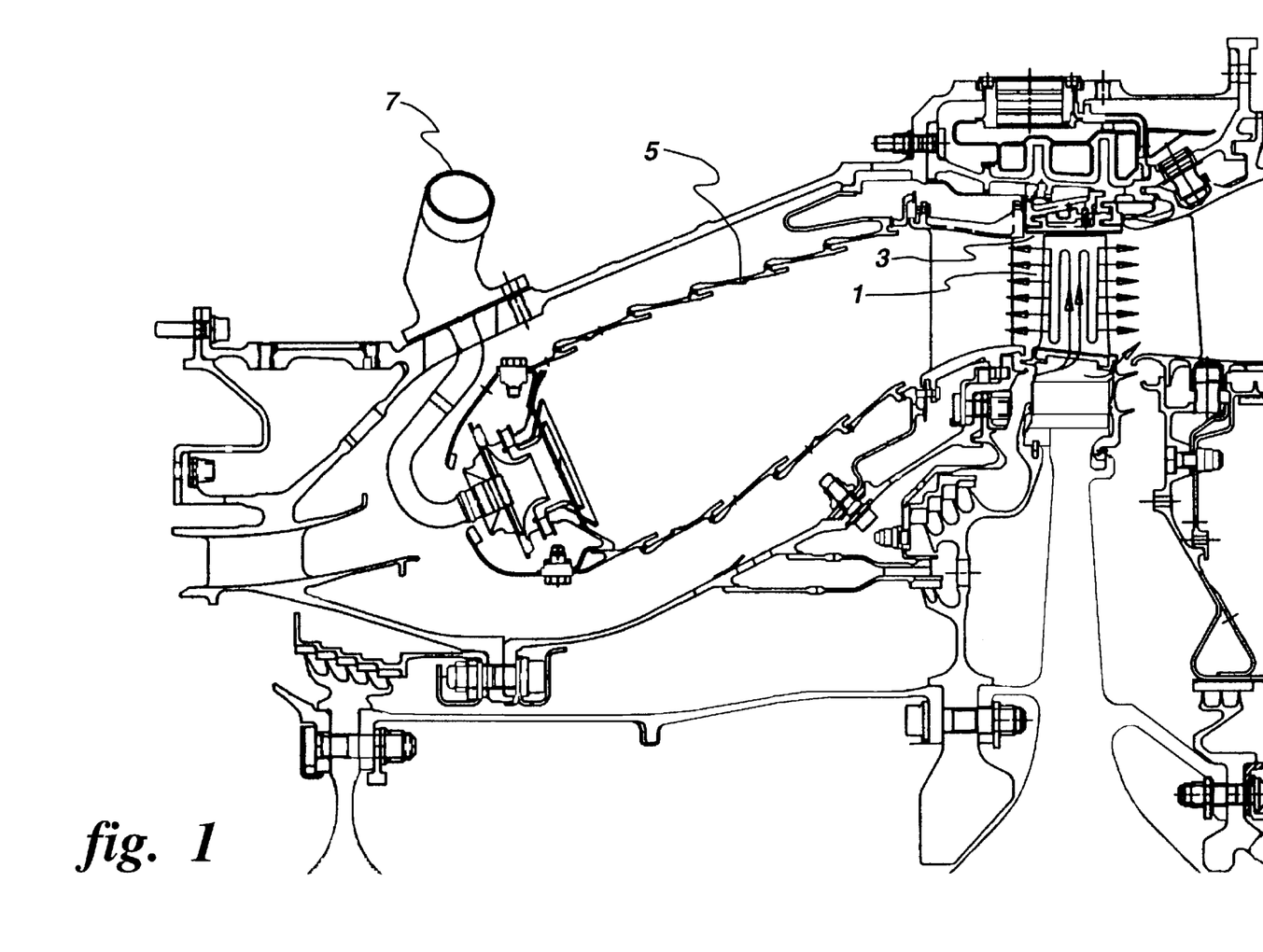
FIG. 1 is a schematic cross-sectional illustration of various operative parts of a gas turbine engine including a blade, shroud, combustor and duct of the present invention.

FIG. 1 depicts the relevant operative parts of a gas turbine. They include turbine blade 1, shroud 3 which is contacted by the blade tip and forms a seal therewith during operation of the engine, combustor wall 5 and duct 7.

Figure 2:
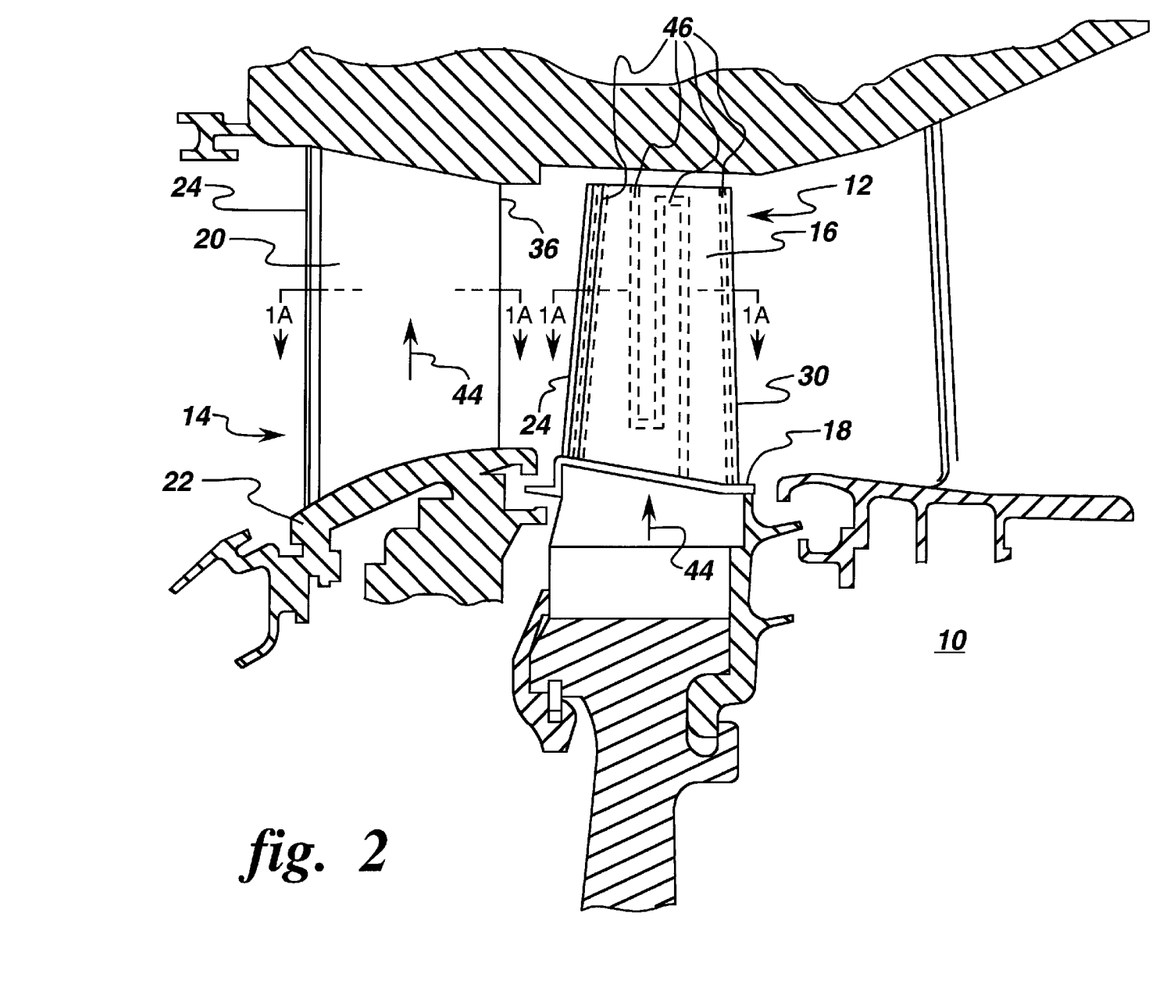
FIG. 2 is a schematic cross-sectional illustration of a portion of a gas turbine engine illustrating a representative arrangement of a blade and vane of the invention.
Figure 2A:
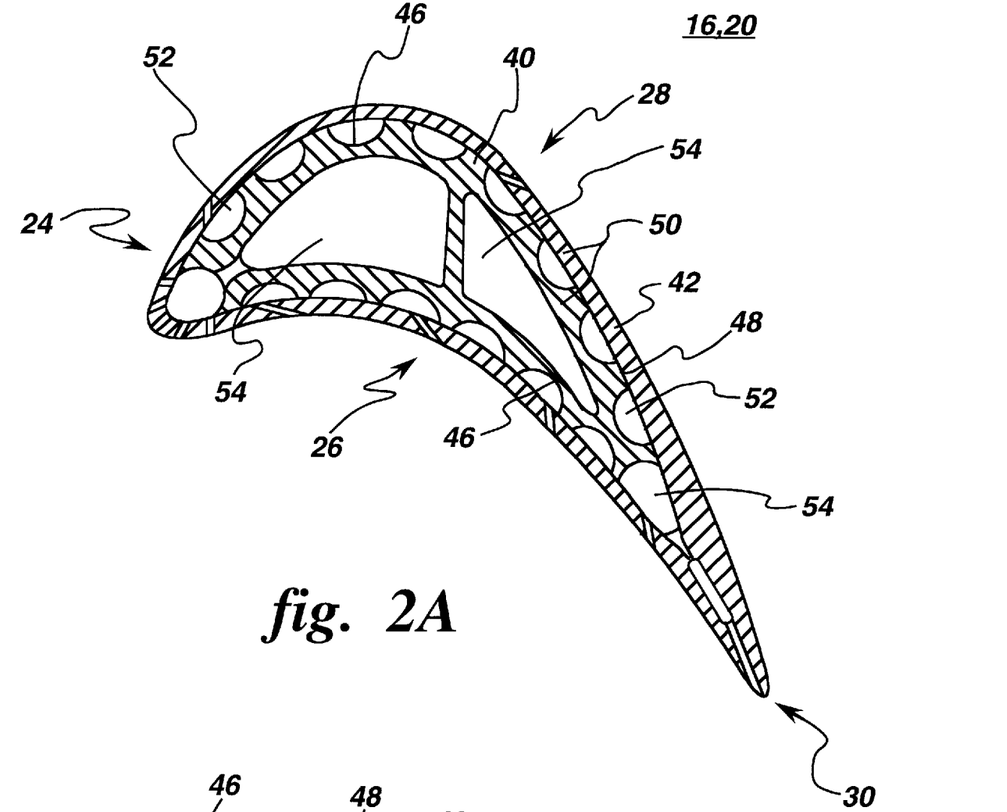
FIG. 2A is schematic cross-sectional illustration, along the lines 2A—2A of FIG. 2, of an airfoil of the invention.

Referring now to FIGS. 2 and 2A, a portion of a turbine engine 10 is shown illustrating a blade 12 and vane 14 of the present invention. Blade 12 and vane 14 are of known external configuration, however, turbine parts according to the invention may also be utilized with different designs, including advanced designs. Blade 12 comprises airfoil 16 that is attached to base 18, as explained further herein. Vane 14 comprises airfoil 20 that is attached to base 22, as explained further herein.

Airfoils 16 and 20 (subsequent references are to airfoil 16) comprise the same essential internal elements, and thus are described with reference to the same FIG. 2A. In similar fashion, bases 18 and 22 have corresponding attachment points for other HGP parts, all generically identified as "base" herein.

Being of known external configuration, prior art airfoils and airfoils 16, 20 of this invention may be described generally as comprising a structural member, frequently of complex shape, that extends generally longitudinally from a base 18 or base 22 (subsequent references are to base 18, but apply to either a base for a blade or a vane) and has a generally convex leading edge 24 connected on one side to a generally concave pressure side wall 26 and on the other side to generally convex suction side wall 28, said pressure side wall 26 and said suction side wall 28 converging to form trailing edge 30. The combination of these elements define an airfoil shape as utilized herein.

Further, airfoils 16, 20 comprise a partially hollow support wall 40 and a skin 42. Support wall 40 extends longitudinally in direction 44 from base 18. Support wall 40 is made from a first material and has at least one longitudinally extending recessed channel 46 formed in a shaped outer surface 48. Skin 42 conforms to shaped outer surface 48 of support wall 40. Skin 42 covers the at least one channel 46 in support wall 40, and is metallurgically bonded to shaped outer surface 48 of wall 40. The combination of support wall 40 and skin 42 forms double wall structure 50. Where recessed channel 46 is covered by skin 42, it forms at least one longitudinally extending internal channel 52.

Even though the essential elements of blade 12 and vane 14 are the same, it will be known to those of ordinary skill to alter the arrangement of these elements to accommodate their differing design criteria, such as altering the thickness and arrangement of the support wall, the degree to which the support wall is hollow, the number and placement of the cooling channels and other design parameters affecting cooling by impingement, convection or cooling holes in the skin to form surface films of air.

Support wall 40 is attached to base 18. Base 18 may be of any suitable configuration and material that permit attachment to and operation within turbine engine 10. Bases 18 having certain dovetail or other configurations for interlocking with other components of an engine 10 made from Ni-base alloys are known. Preferably, support wall 40 is formed integrally with base 18, such as by casting base 18 and support wall 40 together as a single part from a single material. It is believed that it will be further preferred that base 18 and support wall 40 be cast so as to form a directionally solidified or single structure. Other forms of attachment may include, without limitation, casting support wall 40 into a base that is adapted to receive support wall 40, or attaching a preformed support wall 40 to a preformed base 18. It is preferred, however, regardless of the means of attachment, that certain known mechanical properties at the point of attachment, particularly mechanical strength and creep resistance, be maintained.

Support wall 40 extends longitudinally in direction 44 away from base 18, providing the airfoil with a length. Support wall 40 is also partially hollow as represented by hollow regions or cavities 54.

Figure 3:
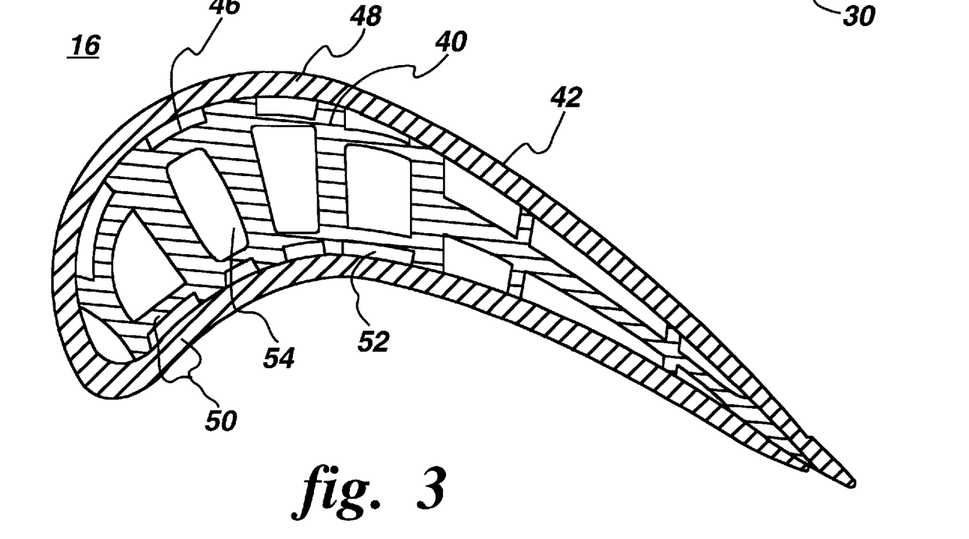
FIG. 3 is a schematic cross-sectional illustration of a second embodiment of an airfoil of the invention, representing a potential turbine blade configuration.
Figure 4:
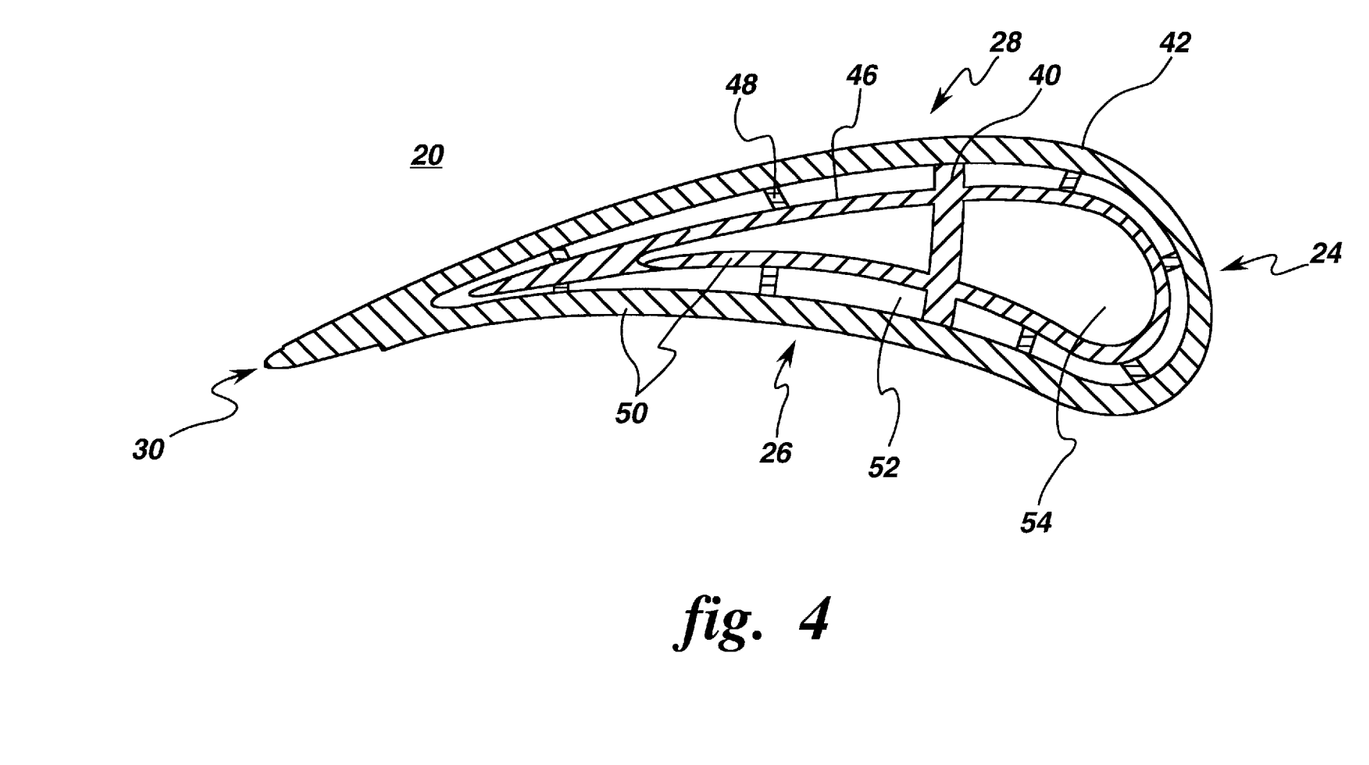
FIG. 4 is a schematic cross-sectional illustration of a third embodiment of an airfoil of the invention, representing a potential turbine vane airfoil configuration.

Hollow regions 54 as well as integral internal channels 52 may be used in the operation of engine 10 to circulate a cooling gas (not shown), such as air, within airfoil 16 in order to cool these articles. The cooling gas is typically supplied through orifices in base 18. In contrast to prior art designs, hollow regions 54 may be of relatively simple design with cross-sectional areas that avoid the necessity of forming intricate hollow regions near the surface of airfoil 16. This is due to the fact that channels 52 are capable of providing such intricate passageways, without the need for casting them entirely within support wall 40. Examples to illustrate this point are shown as FIGS. 3 and 4. FIG. 3 illustrates an alternate support wall 40 cross-section such as could be used in a turbine blade design. FIG. 4 illustrates an alternate support wall 40 cross-section such as could be used in a turbine vane design.

In the case of airfoil 16, it is believed that the cross-section of support wall 40 as shown in FIG. 2A will be similar along its length with regard to its general configuration (e.g. the number of channels 52, the number and arrangement of hollow regions 54, and the cross-sectional area of airfoil 16). However, this is not an essential feature of the invention and this invention is intended to comprehend those designs for which the cross-sectional configuration may vary over the length of airfoil 16.

Support wall 40 may be formed from any suitable material, described herein as a first material. Depending on the intended application for airfoil 16, this could include Ni-base, Co-base and Fe-base superalloys. Fe-base and Co-base alloys may be preferred for relatively larger scale engines, such as industrial gas turbines. Ni-base superalloys may be preferred for relatively smaller scale applications, such as aircraft engines, where the operating gas temperatures are up to about 1,650° C. For such applications, the preferred Ni-base superalloys may be those containing both γ and γ phases, particularly those Ni-base superalloys containing both γ and γ phases wherein the γ phase occupies at least 40% by volume of the superalloy. Such alloys are known to be advantageous because of a combination of desirable properties including high temperature strength and high temperature creep resistance. The first material may also comprise a NiAl intermetallic alloy, as these alloys are also known to possess a combination of superior properties including high temperature strength and high temperature creep resistance that are advantageous for use in turbine engine applications used for aircraft. In the case of the Ni-base alloys described, it is preferred that the tensile strength of the first material be at least 175 MPa at temperatures in the range of 1,100°–1,200° C.

For advanced applications (e.g. applications where the operating temperatures are above about 1,650° C.), it will be preferred to use higher temperature first materials, such as Nb-base alloys. In the case of Nb-base alloys, coated Nb-base alloys having superior oxidation resistance will be preferred, such as Nb/Ti alloys, and particularly those alloys comprising Nb-(27–40)Ti-(4.5–10.5)Al-(4.5–7.9)Cr-(1.5–5.5)Hf-(0–6)V in atom percent. The first material may also comprise a Nb-base alloy that contains at least one secondary phase, such as an Nb-containing intermetallic compound, an Nb-containing carbide or an Nb-containing boride. Such alloys are analogous to a composite material in that they contain a ductile phase (i.e., the Nb-base alloy) and a strengthening phase (i.e., an Nb-containing intermetallic compound, an Nb-containing carbide or an Nb-containing boride).

Referring to FIG. 2A, a support wall 40 of the present invention will have at least one longitudinally extending recessed channel 46 formed in shaped outer surface 48. It is preferred, however, that support wall 40 comprise a plurality of recessed channels 46 so that a plurality of integral channels 52 can be formed just under the surface of skin 42, such that a cooling gas (not shown) may be circulated through internal channel 52.

Said recessed channels may be formed by any suitable forming method. It is preferred that recessed channels 46 be formed integrally with support wall 40, such as by casting them into support wall 40. However, recessed channels 46 may be formed by other methods that are not integral with the formation of support wall 40, such as conventional machining, water-jet machining, etching or other suitable methods.

Recessed channels 46 may be of any suitable cross-section. The cross-section of recessed channel 46 will depend upon factors including the material selected as skin 42 and the thickness of skin 42. It is necessary, however, that the cross-sections of recessed channels 46 be designed such that the combination of the cross-section and skin 42 does not permit skin 42 to be forced into recessed channels 46 during use of airfoil 16. It is believed that recessed channels 46 that are approximately 2.5–7.5 mm wide and 0.5–1.25 mm deep will provide an adequate channel to permit the flow of a cooling gas while avoiding the problems described above.

It is preferred that recessed channels 46 occupy a substantial portion of the area of shaped outer surface 48, such as about 50 percent or more of the double wall portion of the skin 42. Recessed channel or channels 46 may have any suitable configuration over shaped outer surface 48; however, it is preferred that recessed channel or channels 46 extend longitudinally along the length of blade 12 or vane 14 in the general direction indicated by arrow 44 as shown in FIG. 2. Further, the longitudinally extending channel or channels 46 may form many patterns over shaped outer surface 48, such as a serpentine pattern shown in FIG. 2, wherein one continuous channel may extend over a significant portion of shaped outer surface 48. By orienting the at least one channel 46 longitudinally, a channel 52 or channels can be formed that run under the length of particularly hot sections, such as the lengths of leading and trailing edges.

With regard to forming airfoils 16 of the present invention, as well as other HGP parts, one advantage of the present invention is the simplified geometric form of the casting required to form support wall 40 as compared to the more complex castings required to cast integral double wall airfoils as described in U.S. Pat. No. 5,328,331, which incorporates intricate internal cooling passages near the surface of the airfoil. This simplified geometric form will permit a substantial increase in the manufacturing yield of support wall 40 as compared to prior art airfoils when using manufacturing processes such as casting and directional solidification. Another advantage related to the simplified geometric form is that it increases the range of superalloys that may be utilized to form support wall 40 as compared with an integrally formed double wall airfoil. Particularly, it permits the use of stronger superalloys which are typically less castable with respect to small interior features and thin walls. In alloy development of advanced single crystal and directionally solidified alloys, castability is a barrier that eliminates from consideration many very strong materials; the simpler cast geometric forms of the present invention that do not require the casting of an integral outer surface may permit the use of some of these stronger alloys. Also, another advantage associated with simplified geometries is that high casting yields are expected.

Moreover, because of the novel design and construction of the HGP parts of this invention as described briefly above, current Ni-base superalloys which have higher densities due to the presence of higher concentrations of refractory metal strengthening additives such as tantalum, which are needed to achieve strength at the highest temperatures, may be replaced by alloys having lower density strengthening additives, such as titanium. For example, because support wall 40 in the turbine parts of the present invention may in some cases be exposed to lower temperatures than those experienced by prior art HGP parts due to the presence of integral cooling channels 52, it may be possible to use Ti, rather than a refractory metal such as tungsten, tantalum or niobium, to stabilize the strengthening $\gamma$ phase. The use of lighter alloying elements would reduce the alloy density, and translate to reduced weight and higher engine operating efficiency.

Another advantage related to the simplified geometry of support wall 40 is that it is not dependent upon ceramic core limitations. In the manufacture of hollow core HGP parts, one of the limitations which has been recognized in the industry is that both the cavity geometry and the cavity sizes are dictated by ceramic core limitations. Since the sacrificial ceramic core used in casting is a brittle structure, its geometry and size must be selected so that it withstands the casting process without breaking and without substantial distortion. Any distortion of the ceramic core must be accounted for in designing tolerances of the cast HGP part wall thickness, including the possibility that fine core elements may be subject to shifting. Therefore, the designs of the present invention will take advantage of tighter achievable tolerances which translate to reductions in the amount of material required for a given casting; e.g., internal wall thicknesses within the structure may be thinner because they do not have to allow for the possibility that the core used to form the cavity may shift in place during casting.

Skin 42 extends longitudinally along shaped outer surface 48 of support wall 40. Skin 42 conforms to shaped outer surface 48 and covers recessed channels 46. Skin 42 comprises a second material which may be any suitable material and is metallurgically bonded to the shaped outer surface 48 of support wall 40. It is preferred that the thickness of skin 42 be in the range of 0.25–0.1 mm. However, other thicknesses may be utilized depending on the requirements for a particular part.

It is preferred that the support wall 40 be designed, including the selection of the first material, so as to serve as the primary structural member with respect to rotational and other forces caused or experienced during the operation of engine 10, and that skin 42 be designed to withstand thermal stresses and the forces related to the flow of hot gases past the outer surface of the airfoil. However, designs where skin 42 also serves as a significant structural member with respect to operating forces are also possible.

The second material used to form airfoil 42 comprises any suitable material capable of withstanding the operating gas temperatures of a turbine engine, such as about 1,650° C. in the case of current aircraft engines, and higher in the case of advanced designs. Skin 42 must be compatible with and adapted to be metallurgically bonded to the shaped outer surface 48 of support wall 42.

It is essential that skin 42 be metallurgically bonded to support wall 40. This metallurgical bond is preferably formed when skin 42 is deposited onto support wall 40. This bonding may be influences during the deposition by many parameters including the method of deposition, the temperature of the support wall during the deposition, whether the deposition surface is biased relative to the deposition source, and other parameters. Bonding may also be affected by subsequent heat treatment or other processing. In addition, the surface morphology, chemistry and cleanliness of support wall 40 prior to the deposition can influence the degree to which metallurgical bonding occurs. For example, it is known when using sputter deposition, that sputtering the surface to be deposited often improves the degree of bonding between the substrate and subsequently deposited layers.

In addition to forming a strong metallurgical bond between skin 42 and support wall 40, it is necessary that this bond remain stable over time and at high temperatures with respect to phase changes and interdiffusion, as described herein. Thus, it is preferred that the metallurgical bond between these elements be thermodynamically stable such that the strength and ductility of the bond do not deteriorate significantly over time (e.g. up to 3 years) by interdiffusion or other processes, even for exposures at high temperatures on the order of 1,150° C. for Ni-base alloy support walls 40 and Ni-base skins 42, or higher temperatures on the order of 1,300° C. in the case where higher temperature materials are utilized, such as Nb-base alloys.

Where the first material of support wall 40 is an Ni-base superalloy containing both $\gamma$ and $\gamma$ phases or a NiAl intermetallic alloy, second materials for skin 42 may comprise these same materials. Such a combination of skin 42 and support wall materials is preferred for applications such as where the maximum temperatures of the operating environment similar to those of existing engines (e.g. below 1,650° C.). In the case where the first material of support wall 40 is an Nb-base alloy, second materials for skin 42 may also comprise an Nb-base alloy, including the same Nb-base alloy.

For other applications, such as applications that impose temperature, environmental or other constraints that make the use of a metal alloy skin 42 undesirable, it is preferred that skin 42 comprise materials that have properties that are superior to those of metal alloys alone. Such materials include composites in the general form of intermetallic compound ($I_S$)/metal alloy (M) phase composites and intermetallic compound ($I_S$)/intermetallic compound ($I_M$) phase composites. Metal alloy M may be the same alloy as used for support wall 40, or a different material, depending on the requirements of the part. These composites are generally speaking similar in that they combine a relatively more ductile phase M or $I_M$ with a relatively less ductile phase $I_S$. The objective is to create a skin 42 that gains the advantage of both materials. The less ductile material must have superior strength, particularly at high temperatures, and must be adapted to contribute this strength to the composite. It is not sufficient that the less ductile material have high strength by itself. What is important is that the less ductile material have such superior strength and also that it retain such strength in the composite, and after long exposures at high temperatures. The more ductile material must have sufficient low temperature and high temperature ductility and must be adapted to contribute this ductility to the less ductile material, and retain sufficient ductility after long exposures at high temperatures.

One factor which bears on retention of strength in a composite is chemical compatibility of the materials of the constituents. Thus, in order to have a successful composite, the two materials must be compatible. As used herein in regard to composites, the term compatible means that the materials must be capable of forming the desired initial distribution of their phases, and of maintaining that distribution for extended periods of time as described above at use temperatures of 1,150° C. or more, without undergoing metallurgical reactions that substantially impair the strength, ductility, toughness, and other important properties of the composite. Such compatibility can also be expressed in terms of phase stability. That is, the separate phases of the composite should have a stability during operation at temperature over extended periods of time so that these phases remain generally separate and distinct, retaining their separate identities and properties, and do not become a single phase or a plurality of different phases due to interdiffusion. Compatibility can also be expressed in terms of morphological stability of the interphase boundary interface between the $I_S/M$ or $I_S/I_M$ composite layers. Such instability may be manifested by convolutions which disrupt the continuity of either layer. It is also noted that within a given skin 42, a plurality of $I_S/M$ or $I_S/I_M$ composites may also be used, and such composites are not limited to two material or two phase combinations. The use of such combinations are merely illustrative, and not exhaustive or limiting of the potential combinations. Thus $M/I_M/I_S$, $M/I_{S1}/I_{S2}$ (where $I_{S1}$ and $I_{S2}$ are different materials) and many other combinations are possible.

In a preferred embodiment, where skin 42 is an $I_S/M$ or $I_S/I_M$ composite, the composite will comprise a plurality of alternating layers of these materials. The thickness of each of the plurality of layers may be constant or variable. It is preferred in both types of composites that the volume fraction of $I_S$ in the skin be in the range of 0.3–0.7. If the skin contains too little $I_S$, the composite will not have a significant improvement in strength over $I_M$ or M; if it contains too much $I_S$, skin 42 will not have a significant gain in fracture toughness over $I_S$.

It is also preferred that the first layer that is in contact with the shaped outer surface 48 of support wall 40 be the more ductile phase, M or $I_M$, to foster metallurgical bonding with the shaped outer surface 48 of support wall 40. Because the materials used for M or $I_M$, $I_S$ and the support wall may have different coefficients of thermal expansion, it may be preferred to form a graded skin 42, such that the portion of skin 42 closest to support wall 40 has a higher volume fraction of the phase that has a thermal expansion coefficient closest to that of the first material of support wall 40, to avoid exacerbating stresses induced by the expansion coefficient mismatch that will occur during normal thermal cycling. Similarly, it may be desirable to provide a lower volume fraction of the phase that has a higher thermal expansion coefficient in the portion of skin 42 farthest from support wall 40. Such grading may also be used to promote certain other properties, such as oxidation resistance, strength or other properties within specific portions of skin 42.

Since the toughening M or $I_M$ phase and the strengthening $I_S$ phase must coexist at a plurality of interfaces for long exposures at high temperatures, stability of these interfaces will be important to maintaining the mechanical properties of skin 42. Likewise, the interface of skin 42 and support wall 40 must remain stable over time. The selection of the chemistries of the first and second materials must be made so as to achieve thermodynamic equilibrium between the various constituents. Some interdiffusion is necessary to promote metallurgical bonding between them, but compositions must be selected and the materials processed to avoid excessive interdiffusion leading to a loss of phase stability or substantial alteration in the mechanical properties.

In composite skins 42, with respect to the various combinations of first material for support wall 40, $I_S$ and M or $I_M$, the number of possible combinations is large. Small variations in the composition of the first material portend the possibility of large or small changes in $I_S$, M or $I_M$ to achieve compatibility as described above. Also, more than one acceptable combination of $I_S$, M or $I_M$ is likely for a given first material. In $I_S/M$ composites, it is preferred in many combinations that $I_S$ and M be selected so as to comprise one or more of the constituents of the first material, such as Ni and Cr in the case of Ni-base alloys, so as to promote metallurgical bonding and stability as described herein.

For example, in the case where support wall 40 is a Ni-base superalloy comprising a mixture of both γ and γ′ phases, $I_S$ may comprise $Ni_3$[Ti, Ta, Nb, V], NiAl, $Cr_3Si$, [Cr, Mo]$_x$Si, [Ta, Ti, Nb, Hf, Zr, V]C, $Cr_3C_2$ and/or $Cr_7C_3$ intermetallic compounds and intermediate phases and M may comprise a Ni-base superalloy comprising a mixture of both γ and γ′ phases. In Ni-base superalloys comprising a mixture of both γ and γ′ phases, the elements Co, Cr, Al, C and B as well as varying combinations of Ti, Ta, Nb, V, W, Mo, Re, Hf and Zr are nearly always present as alloying constituents. Thus, the constituents of the exemplary $I_S$ materials described correspond to one or more materials typically found in Ni-base superalloys as may be used as first material, and thus may be adapted to achieve the phase and interdiffusional stability described herein.

As an additional example in the case where the first material comprises NiAl intermetallic alloy, $I_S$ may comprise $Ni_3$[Ti, Ta, Nb, V], NiAl, $Cr_3Si$, [Cr, Mo]$_x$Si, [Ta, Ti, Nb, Hf, Zr, V]C, $Cr_3C_2$ and $Cr_7C_3$ intermetallic compounds and intermediate phases and $I_M$ may comprise a $Ni_3Al$ intermetallic alloy. Again, in NiAl intermetallic alloys, one or more of the elements Co, Cr, C and B as well as varying combinations of Ti, Ta, Nb, V, W, Mo, Re, Hf and Zr are nearly always present as alloying constituents. Thus, the constituents of the exemplary $I_S$ materials described correspond to one or more materials typically found in NiAl alloys as may be used as first material, and thus may be adapted to achieve the phase and interdiffusional stability described herein.

As another example, in the case where support wall 40 is an Nb-base alloy, including an Nb-base alloy containing at least one secondary phase, $I_S$ may comprise an Nb-containing intermetallic compound, an Nb-containing carbide or an Nb-containing boride, and M may comprise an Nb-base alloy. It is preferred that such $I_S/M$ composite comprise an M phase of an Nb-base alloy containing Ti such that the atomic ratio of the Ti to Nb (Ti/Nb) of the alloy is in the range of 0.2–1, and an $I_S$ phase comprising a group consisting of Nb-base suicides, $Cr_2$ [Nb, Ti, Hf], and Nb-base aluminides, and wherein Nb, among Nb, Ti and Hf, is the primary constituent of $Cr_2$[Nb, Ti, Hf] on an atomic basis. These compounds all have Nb as a common constituent, and thus may be adapted to achieve the phase and interdiffusional stability described herein.

Figure 5:
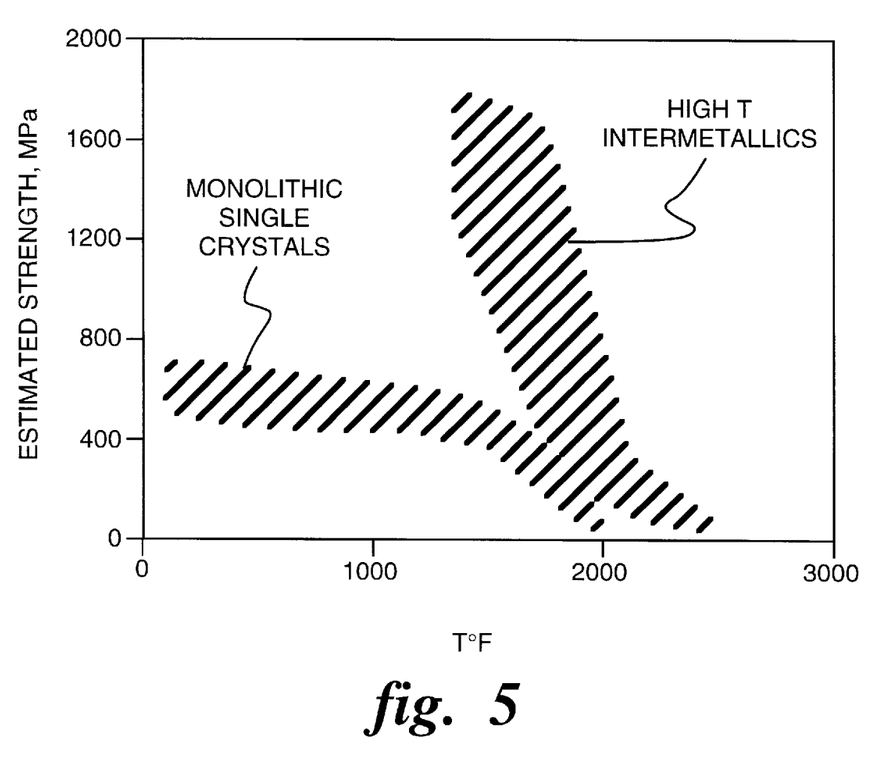
FIG. 5 is a plot in which the projected yield strength and 100 hr/1% creep limits as a function of temperature generally comparing present turbine part alloys with intermetallic composites.

Skins 42 comprising composite materials have a weight advantage over prior art HGP parts and integrally formed double wall parts, thus improving the efficiency of engine 10. In most cases, intermetallic compounds and intermediate phases have densities that are substantially less than metal alloys, particularly Ni-base superalloys. In a microlaminate configuration, the density is estimated to be more on the order of 6.5 g/cc, rather than the 8.5–8.6 g/cc found in common Ni-base superalloys. Also, calculations for composites, and particularly microlaminates, indicate that they should exhibit significantly higher strength at a given elevated temperature than Ni-base superalloys, as shown in FIG. 5. Therefore, they can be utilized in parts and engines that work at higher operating gas temperatures and efficiencies than prior art Ni-base superalloys.

Figure 6:
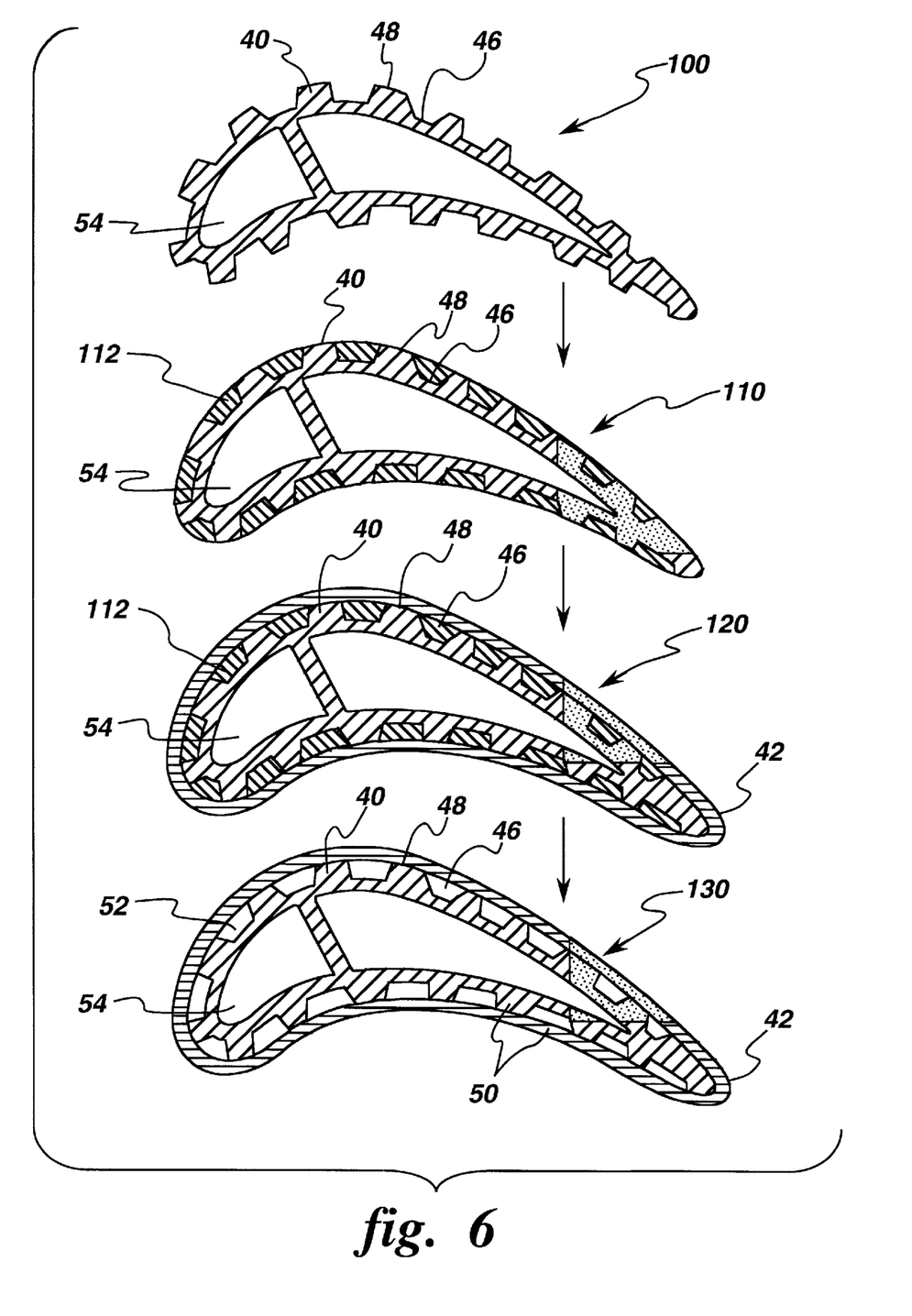
FIG. 6 is a schematic diagram which illustrates a method of making double wall parts.

Referring to FIG. 6 and FIG. 2, a typical method of making double wall airfoils 16 comprises the steps of: forming 100 a partially hollow support wall 40 that is attached to and extends longitudinally 44 from base 18 and has shaped outer surface 48, said support wall 40 formed from a first material and having at least one recessed channel 46 formed in shaped outer surface 48; filling 110 the at least one recessed channel 46 with channel filling means 112 so as to make upper surface 114 of channel filling means 112 substantially continuous with shaped outer surface 48; depositing 120 skin 42 of a second material onto the shaped outer surface 48 of the support wall 40 such that the skin 42 conforms to the shaped outer surface 48 of the support wall 40 and covers recessed channel 46 and channel filling means 112, and such that skin 42 is metallurgically bonded to shaped outer surface 48 of support wall 40, wherein the combination of skin 42 and support wall 40 form double wall airfoil structure 50; and removing 130 channel filling means 112, thereby creating integral internal channel 52 within double wall airfoil structure 50.

Referring to FIG. 6, any suitable method of forming 100 support wall 40 may be utilized, depending upon the first material selected, the overall desired configuration of support wall 40 (e.g. part type, complexity of the internal cavities which comprise the hollow spaces, desired channel configuration) and other factors. Airfoil 16 may be cast integrally with base 18, or otherwise attached to base 18 as described herein. Any suitable first material may be selected, such as a metal alloy, an $I_S/M$ composite or an $I_S/I_M$ composite, as described herein.

A preferred step of forming 100 would comprise casting support wall 40. In the case of Ni-base superalloys and NiAl alloys, it is further preferred that support wall 40 be cast so as to form single crystal or directionally solidified microstructures and thereby improve the high temperature strength and creep resistance of support wall 40.

It is further preferred that all features of support wall 40, including the at least one recessed channel 46, be formed integrally in support wall 40 as part of the forming process, such as by casting the channels as a feature into the shaped outer wall 48. Such a method would minimize the number of steps required to form support wall 40. However, it is also possible that the at least one recessed channel be formed in a separate operation within the overall step of forming 100 support wall 40. Such channel forming operations comprise machining, such as mechanical machining with a cutting means, electro-discharge machining or water jet machining; patterning and etching, such as photopatterning and chemical etching or electro-etching; mechanical abrasion; or other suitable operations.

Referring again to FIG. 6, after forming 100 the support wall, the next step is filling 110 the at least one recessed channel 46 with channel filling means 112. Filling 110 with channel filling means 112 may be done using any suitable method, and will depend on what type of channel filling means 112 is utilized. Channel filling means 112 may comprise metal alloys, ceramics, metal alloy/ceramic mixtures, polymers or other suitable means.

Channel filling means 112 must first be able to be adapted to fill the at least one recessed channel 46 so as to form upper surface 114 that is substantially continuous with shaped outer surface 48. If channel filling means 112 is not continuous, then it is possible to produce defects in skin 42 at the edges of the recessed channels 46 when skin 42 is subsequently deposited. For example, if channel filling means 112 shrinks or pulls away from the recessed channels 46, a gap would result, into which skin 42 may be deposited. This may produce a defect in skin 42, that could result in an area of mechanical weakness in skin 42.

For Ni-base superalloys, a channel filling means 112 comprising a metal alloy braze comprising an alloy of Cu and Ni is preferred, where the alloy comprises Ni-25-35Cu, by weight. This alloy can be applied into the recessed channels 46 so as to form an excess within the channel, such as by brazing. The excess may be removed by machining or other suitable removal means to form top surface 114 that is substantially continuous with shaped outer surface 48.

Depending on the channel filling means 112 characteristics at elevated temperatures, it may be desirable to control the temperature during the deposition of skin 42, so as to avoid disturbing channel filling means 112 or disrupting the continuity of the interface between channel filling means 112 and support wall 40, or substantial interaction between channel filling means 112 and skin 42 or the support wall 40. In the case of the Ni—Cu braze described, it is thought to be desirable to maintain the temperature during deposition at about 1,200° C. or less, and also to maintain the deposition time as short as possible.

Deposition 120 of skin 42 may be done by any suitable method. Known deposition methods comprise physical vapor deposition, such as evaporation, sputtering and plasma spraying; chemical vapor deposition, including metal-organic decomposition; and plating, such as electroplating. Evaporation is preferred for most skin materials, because it generally has higher deposition rates than other deposition methods. In particular, electron beam evaporation is preferred, again related to the deposition rates that are attainable.

It is most preferred to use an electron beam evaporation method described in U.S. Pat. No. 5,474,809, which is herein incorporated by reference. This method comprises evaporating one component material through a molten pool of another component material. It is believed that a large number of materials useful as component materials may be evaporated using the method described herein, including pure metals, metal alloys, ceramics, and other inorganic metallic compounds. However, at the present time it is particularly preferable to use the method for evaporative deposition of multi-constituent metal alloys.

This method enables the making an evaporated deposit of a material by the steps of:

selecting a first component and a second component having a composition comprising a plurality of elements, wherein the selection ensures that the first component is adapted to transport the plurality of elements of the second component through the first component when they are in touching contact with one another in a molten state and that the plurality of elements of the molten second component in molten first component are preferentially evaporated with respect to the first component;

placing a quantity of the first component over a quantity of a second component in a crucible means contained within a housing means that is adapted to be evacuated so that the first component at least partially covers the second component;

evacuating the housing means;

supplying heat to the first component sufficient to create a molten zone within and through this component such that the molten zone of the first component is in touching contact with the second component and thereby creates a molten zone within the second component, wherein the plurality of elements of the second component are transported through the molten zone rich in the first component to a top surface where they are preferentially evaporated with respect to the first component thereby forming a vapor stream; and collecting a condensate having a thickness from the vapor stream on a collection means, wherein the composition of the condensate closely resembles the composition of the second component throughout the thickness of the condensate.

With respect to many high temperature component materials, this method may be described as a method of making an evaporated deposit, comprising the steps of:

selecting a first component having a first melting point, and a second component having a composition comprising a plurality of elements and having a second melting point, wherein the selection ensures that the first melting point is greater than the second melting point, and that the first component is adapted to transport the plurality of elements of the second component through the first component when they are in touching contact with one another in a molten state, and that the plurality of elements of the molten second component in molten first component are preferentially evaporated with respect to the first component;

placing a quantity of the first component over a quantity of a second component in a crucible means contained within a housing means that is adapted to be evacuated so that the first component at least partially covers the second component;

evacuating the housing means;

supplying heat to the first component sufficient to create a molten zone within and through this component such that the molten zone of the first component is in touching contact with the second component and thereby creates a molten zone within the second component, wherein the plurality of elements of the second component are transported through the molten zone of the first component to a top surface where they are preferentially evaporated with respect to the first component thereby forming a vapor stream; and collecting a condensate having a thickness from the vapor stream on a collection means, wherein the composition of the condensate closely resembles the composition of the second component throughout the thickness of the condensate.

It is also possible to adapt this evaporation method such that it may be used to make an evaporated deposit by the steps of:

selecting a first component and a second component having a composition comprising a plurality of elements, wherein the selection ensures that the first component is adapted to transport the plurality of elements of the second component through the first component when they are in touching contact with one another in a molten state and that at least one of the plurality of elements of the molten second component in molten first component is preferentially evaporated with respect to the first component;

placing a quantity of the first component over a quantity of a second component in a crucible means contained within a housing means that is adapted to be evacuated so that the first component at least partially covers the second component;

evacuating the housing means;

supplying heat to the first component sufficient to create a molten zone within and through this component such that the molten zone of the first component is in touching contact with the second component and thereby creates a molten zone within the second component, wherein the plurality of elements of the second component are transported through the molten zone rich in the first component to a top surface where they are preferentially evaporated with respect to the first component thereby forming a vapor stream; and collecting a condensate having a thickness from the vapor stream on a collection means, wherein the composition of the condensate closely resembles the composition of the second component throughout the thickness of the condensate, except that the condensate also contains controlled quantities of the first component throughout the thickness.

In a preferred embodiment, the first component is a refractory metal, such as W, Re, Os, Ta, Mo, Nb, Ir, Ru, or Hf, or alloys of these metals, and the second component is a multi-constituent metal alloy, such as a Ni-base, Co-base or Fe-base alloy.

This evaporation method is particularly advantageous in that it permits the evaporation and subsequent collection as a condensate of second components that have a composition closely resembling the component material from which they were evaporated and exclusive of the elements in the first component. One of the significant problems in the use of evaporative techniques generally, is that without elaborate controls, the condensate of multi-constituent component material usually does not have a composition that closely resembles the composition of the starting component material. This is due to the fact that at a particular temperature the various elements of a material comprising a plurality of elements evaporate at differing rates, which are related to the vapor pressures of those elements at the evaporation temperature. However, this evaporation method permits the collection of a condensate having a composition that closely resembles the composition of the starting component material, without the need for elaborate compositionally oriented controls over the deposition process.

Another significant advantage in the use of this technique is that it permits the deposition of the compositionally controlled condensates at rates that are very high for an evaporative process, on the order of at least 25 and often 250 or more microns/min.

The combination of these advantages provides a method for the evaporative deposition of high temperature alloys and other materials for uses in structural applications, such as skin 42.

Yet another advantage of this evaporation technique is that the propensity of the molten pool from which the component material is evaporated to splatter during the course of the deposition is greatly reduced.

The step of removing 130 channel filling means 112 may be done using any suitable method, such as melting/extraction, chemical etching, pyrolysis or other formation of volatile reaction products, or other methods. In the case of metal alloy brazes, the braze may be either removed by melting/extraction or etching.

What is claimed is:

1. A hot gas path turbine part having an outer double wall, comprising:

a partially hollow support wall that is attached to and extends longitudinally from a base and has a shaped outer surface, said support wall being formed from a first material and having at least one longitudinally extending recessed channel formed in the shaped outer surface; and a skin made from a second material which conforms to, covers and is metallurgically bonded to the shaped outer surface of the support wall and covers the at least one longitudinally extending recessed channel, wherein the combination of the skin and the support wall form a double wall structure and the covered, recessed channel forms at least one longitudinally extending integral internal channel located within the double wall, and wherein the second material comprises an $I_S/M$ or $I_S/I_M$ composite in the form of a microlaminate having a plurality of alternating layers of $I_S$ and M or $I_M$.

2. A turbine part according to claim 1 which is a shroud.

3. A turbine part according to claim 1 which is a combustor.

4. A turbine part according to claim 3 which is a duct.

5. A turbine part according to claim 1 wherein the first material comprises a metal alloy, an $I_S/M$ composite or an $I_S/I_M$ composite.

6. A turbine part according to claim 1 wherein the first material is a metal alloy having a single crystal or directionally solidified microstructure.

7. A turbine part according to claim 1, wherein the second material is an $I_S/M$ composite.

8. A turbine part according to claim 7 wherein a total combined thickness of the $I_S$ layers is $I_{SSUM}$ and a total combined thickness of the M layers is $M_{SUM}$, and the ratio $I_{SSUM}/I_{SSUM}+M_{SUM}$ is in the range of about 0.3–0.7.

9. A turbine part according to claim 8 wherein a first layer of the second material forming said skin is an M layer and is metallurgically bonded to the shaped outer surface of the support wall.

10. A turbine part according to claim 7 wherein the arrangement of the plurality of alternating layers of $I_S$ and M is graded to provide that the skin contains a higher volume fraction of the layers of either $I_S$ or M, whichever has a coefficient of thermal expansion that most closely matches a coefficient of thermal expansion of the first material, in a portion of the skin adjacent to the support wall.

11. A turbine part according to claim 1 wherein the second material is an $I_S/I_M$ composite.

12. A turbine part according to claim 1 wherein a total combined thickness of the $I_S$ layers is $I_{SSUM}$ and a total combined thickness of the $I_M$ layers is $I_{MSUM}$, and the ratio $I_{SSUM}/I_{SSUM}+I_{MSUM}$ is in the range of about 0.3–0.7.

13. A turbine part according to claim 10 wherein a first layer of the second material forming said skin is an $I_M$ layer and is metallurgically bonded to the shaped outer surface of the support wall.

14. A turbine part according to claim 1 wherein the first material is from a group consisting of Ni-base superalloys containing γ and γ phases and NiAl intermetallic alloys, and the second material is from a group consisting of Ni-base superalloys containing γ and γ phases, NiAl intermetallic alloys, $I_S/M$ composites and $I_S/I_M$ composites.

15. A turbine part according to claim 14 wherein the second material is an $I_S/M$ composite comprising an $I_S$ from a group consisting of $Ni_3$[Ti,Ta,Nb,V], NiAl, $Cr_3$Si, [Cr,Mo] xSi, [Ta,Ti,Nb,Hf,Zr,V]C, $Cr_3C_2$ and $Cr_7C_3$ intermetallic compounds and intermediate phases and an M of a Ni-base superalloy comprising a mixture of γ and γ phases.

16. A turbine part according to claim 14 wherein the second material is an $I_S/I_M$ composite comprising an $I_S$ from a group consisting of $Ni_3$[Ti,Ta,Nb,V], NiAl, $Cr_3$Si, [Cr,Mo] xSi, [Ta,Ti,Nb,Hf,Zr,V]C, $Cr_3C_2$ and $Cr_7C_3$ intermetallic compounds and intermediate phases and an $I_M$ of a $Ni_3$Al intermetallic compound.

17. A turbine part according to claim 1 wherein the first material is an Nb-base alloy and the second material is an $I_S/M$ composite comprising an $I_S$ from a group consisting of Nb-containing intermetallic compounds, Nb-containing carbides and Nb-containing borides and an M of an Nb-base alloy.

18. A turbine part according to claim 17 wherein the first material is an Nb-base alloy containing Ti such that the atomic ratio of the Ti to Nb (Ti/Nb) of the alloy is in the range of about 0.5–1.

19. A turbine part according to claim 17 wherein the $I_S/M$ composite comprises an M of an Nb-base alloy containing Ti such that the atomic ratio of the Ti to Nb (Ti/Nb) of the alloy is in the range of about 0.2–1, and an $I_S$ from a group consisting of Nb-base suicides, $Cr_2$[Nb, Ti, Hf], and Nb-base aluminides, and wherein Nb is the primary constituent of $Cr_2$[Nb, Ti, Hf] on an atomic basis.

20. A turbine part according to claim 1 wherein said skin has a thickness in the range of about 0.25–1.0 mm.

* * * * *